United States Patent [19]

Hou

[11] Patent Number: 5,437,959
[45] Date of Patent: Aug. 1, 1995

[54] PROTECTIVE COATING FOR IMAGING ELEMENTS

[75] Inventor: Anchi Hou, Towanda, Pa.

[73] Assignee: E. I. Du Pont de Nemours and Company, Wilmington, Del.

[21] Appl. No.: 186,342

[22] Filed: Jan. 25, 1994

[51] Int. Cl.$^6$ .............................................. G03C 1/805
[52] U.S. Cl. .................................. 430/256; 430/257; 430/262; 430/263
[58] Field of Search ................ 430/256, 257, 262, 263

[56] References Cited

U.S. PATENT DOCUMENTS

| | | | |
|---|---|---|---|
| 4,329,420 | 5/1982 | Bopp | 430/293 |
| 4,921,776 | 5/1990 | Taylor, Jr. | 430/293 |
| 4,971,893 | 11/1990 | Taylor, Jr. | 430/293 |
| 5,001,036 | 3/1991 | Choi | 430/263 |
| 5,019,536 | 5/1991 | Taylor, Jr. | 428/220 |
| 5,087,549 | 2/1992 | Peiffer | 430/263 |
| 5,234,790 | 8/1993 | Lang et al. | 430/263 |
| 5,294,516 | 3/1994 | Sato et al. | 430/262 |

*Primary Examiner*—Hoa Van Le

[57] ABSTRACT

An element comprising, in order: (a) a removable substrate; (b) a transparent, nonphotosensitive, polymeric layer having a thickness of less than about 0.002 cm and a gloss of 45–70; said polymeric layer consisting essentially of at least one thermoplastic polymer having an elongation at break of greater than 30%, a glass transition temperature of 35°–70° C.; and (c) an elastomeric layer and optionally an additional, different removable substrate (d) adjacent to the elastomeric layer, wherein the polymeric layer exhibits improved adhesion to the removable substrate (a) when removable substrate (d) is removed is described.

7 Claims, No Drawings

PROTECTIVE COATING FOR IMAGING ELEMENTS

FIELD OF THE INVENTION

This invention relates to a protective coating for imaged surfaces. More particularly, this invention relates to a protective polymeric overcoat layer for an image bearing surface wherein said overcoat layer has improved adhesion, low gloss, and greater solvent compatibility.

BACKGROUND OF THE INVENTION

Image-bearing photosensitive surfaces, such as prepress proofs and photographs, can be prepared using known techniques. Such photosensitive surfaces frequently have a protective coating on their surface to prevent or limit scratching, marring, or other imperfections in the image-bearing surface. The covering must be optically clear so as not to obscure or distort the image. It should also have flexibility, durability and good adhesion to the image-bearing photosensitive element.

Prepress proofs may be prepared from photosensitive materials that are either positive- or negative-working. A positive-working material is described in U.S. Pat. No. 3,649,268 to Chu and Cohen, and may contain tacky, photohardenable compositions which, when exposed imagewise to actinic radiation, harden in the exposed image areas, resulting in tacky and complementary non-tacky image areas. The image can be developed by applying colored particulate materials such as toners or pigments which selectively adhere to the unexposed, tacky image areas.

A negative-working process is described in U.S. Pat. No. 4,174,216 to Cohen and Fan, which teaches a negative-working element having a support; a tacky, nonphotosensitive contiguous layer; a photohardenable, photoadherent layer; and a strippable coversheet. After, imagewise exposure to actinic radiation, the coversheet is peeled away, carrying with it the exposed areas of the photoadherent layer, and leaving behind, the unexposed areas of the photoadherent layer which adhere to the tacky contiguous layer beneath. The areas of the tacky contiguous layer that do not contain the unexposed photoadherent layer, may then be toned with a finely divided particulate material. Different colored layers can be prepared and assembled in register over one another to form multilayer color proofs, as is well known to those skilled in the art. U.S. Pat. No. 4,053,313 to Fan describes a similar negative-working system which is developed by solvent washout.

Alternatively, a photosensitive imaging system may be (a) precolored with dyes and/or pigments or other coloring materials, (b) developed by washout solvents, and/or (c) contain photoplasticizing agents instead of photohardening agents. Other variations are known to those skilled in the art.

In addition to various photopolymer elements, other non-silver halide systems, e.g., diazo systems, are useful in preparing multicolor proofs.

Prepress color proofs such as those described above, may be covered with a protective covering or coversheet. One type of protective covering is exemplified in Cohen and Fan, U.S. Pat. No. 4,174,216. The patent describes a positive-working photosensitive element comprising a photosensitive layer and a polyester coversheet. The element is exposed overall to actinic radiation and the polyester coversheet is subsequently removed. Following subsequent development, a proof with a desirable 20° gloss level of about 65 gloss units is obtained. However, despite this desired gloss level, the proof has poor durability and is susceptible to crazing, scratching, and marring.

A second type of overcoat or protective covering is also described in Cohen and Fan, U.S. Pat. No. 4,174,216. The patent describes a negative-working element comprising a polyester cover sheet, a photosensitive layer, and an organic contiguous layer. The organic contiguous layer is laminated to the prepress proof and exposed overall with the polyester coversheet remaining intact. The result is a proof with a more durable finish, however, the gloss associated with the reflective, highly transparent, integral, polyester coversheet is unacceptably high, i.e., about 107 gloss units measured at 20°. High gloss has long been recognized to be unacceptable by those skilled in the proofing art, and considerable effort has focused on ways to achieve a lower gloss, protective coating that is durable and resistant to crazing, scratching marring, etc.

A third type of protective coating is described in Bopp, U.S. Pat. No. 4,329,420. The coating consists of an integral layer of plastic film, such as polyester, that is coated with a nonphotoactive adhesive, and applied to the proof by lamination. This type of protective coating is indistinguishable from the second type of cover sheet discussed above in that the coating is durable, but exhibits unacceptable high gloss.

A fourth type of protective coating is described in Taylor, U.S. Pat. No. 5,019,536. This protective coating contains a thin and substantially transparent, nonphotosensitive, integral polymeric layer on a strippable substrate. The polymeric layer comprises a mixture of slightly incompatible polymers. In one embodiment, a wetting layer is provided on the side of the polymeric layer opposite the strippable substrate, and a covering film may be provided over the wetting layer. The protective coating provides the required gloss, however, having two slightly incompatible polymers increases the possibility for variability in coating solutions and therefore variability in the final product. Also, if the wetting layer and the covering film are present, unacceptable adhesion may occur. In other words, when the covering film is peeled off, part of the wetting layer and polymeric layer may peel off with it. Furthermore, the protective covering is incompatible with flammable solvents which is an environmental concern.

Accordingly, a need exists for a protective coating or overcoat which provides the necessary low gloss, the required adhesion to the strippable substrate and compatibility with flammable solvents. The element of the invention satisfies these requirements.

SUMMARY OF THE INVENTION

The present invention is directed to an element comprising, in order:
  (a) a removable substrate;
  (b) a transparent, nonphotosensitive, polymeric layer having a thickness of less than 0.002 cm and a gloss of 45–70; said polymeric layer consisting essentially of at least one thermoplastic polymer having an elongation at break of greater than 30%, and a glass transition temperature of 35°–70° C.; and
  (c) an elastomeric layer.

In another embodiment, the element may have another different removable substrate (d) adjacent to the elastomeric layer, but opposite the polymeric layer. In this embodiment, the polymeric layer exhibits improved adhesion to the first removable substrate (a) when the second removable substrate (d) is removed, e.g., peeled off.

In still another embodiment, the invention is directed to an element comprising in order:
(a) a transparent, nonphotosensitive, polymeric layer having a thickness of less than 0.002 cm; said polymeric layer consisting essentially of at least one thermoplastic polymer having an elongation at break of greater than 30%, and a glass transition temperature of 35°–70° C.; and
(b) an elastomeric layer; and
(c) a prepress color proof.

The invention is also directed to a process for preparing a prepress color proof bearing the protective coating or overcoat described in this invention.

DETAILED DESCRIPTION OF THE INVENTION

The present invention is directed to an element comprising, in order: (a) a removable substrate, (b) transparent, nonphotosensitive, polymeric layer having a thickness of less than 0.002 cm and a gloss of 45–70; said polymeric layer consisting essentially of at least one thermoplastic polymer having an elongation at break of greater than 30%, and a glass transition temperature of 35°–70° C.; and (c) an elastomeric layer. Optionally, a second, different removable substrate (d) may be present adjacent to the elastomeric layer but opposite the polymeric layer.

Surprisingly and unexpectedly, it was found that the element of the invention has the required low gloss, the required adhesion to the removable substrate, and is compatible with flammable solvents. It also requires only one polymer in the polymeric layer thereby eliminating the variability in coating solutions that is seen when using a polymeric layer containing two slightly incompatible polymers.

In addition, the protective coating or overcoat of this invention may be applied to many types of image-bearing surfaces, e.g., a conventional silver halide photograph, where it is desired to provide a clear protective covering having a predetermined level of gloss. The protective coating or overcoat of the invention may also be applied to nonimaged, glossy surfaces to obtain a desired level of lowered gloss.

POLYMERIC LAYER

The element of the invention contains a polymeric layer that is situated between the removable substrate and the elastomeric layer. The polymeric layer comprises a thermoplastic polymer which is preferably an acrylate type thermoplastic polymer. Optionally, a variety of additives such as optical brighteners, ultraviolet light attenuators, antioxidants, plasticizers, coating aids, etc. may be present.

The thermoplastic polymer has (a) a solubility in acetone of at least 15 grams per 100 grams of acetone at 25° C. and preferably at least 20 grams per 100 grams of acetone at 25° C., (b) an elongation at break of greater than 30%, preferably greater than 40%, and (c) a glass transition temperature of 35°–70° C., preferably 50°–65° C. The thermoplastic polymer may be used in combination with other compatible thermoplastic polymers to adjust the properties of the polymer to the above recited ranges. In other words, compatible polymers may also be present if a film having a particular set of properties is desired. The term "compatible" as used herein means the ability of a mixture of two or more polymers to remain dispersed within one another without segregation or phase separation from each other over time.

Acrylate type thermoplastic polymers that are suitable for practicing the claimed invention include methacrylate homopolymers and copolymers, acrylate homopolymers and copolymers. Preferred thermoplastic polymers include poly(ethyl methacrylate) or PEMA, poly(butylmethacrylate) or PBMA, and methyl methacrylate copolymer. These polymers are distributed under the tradename Elvacite ® acrylic resins manufactured by ICI Acrylics Corp., Wilmington, Del., or Carboset ® polymers manufactured by B.F. Goodrich Co., Brecksville, Ohio.

Solubility, elongation at break and glass transition temperature (Tg) for some of the polymers suitable for practicing the claimed invention are indicated in the table below.

| POLYMER NO. | POLYMER NAME | Tg (°C.) | ELONGATION AT BREAK (23° C., 50% RELATIVE HUMIDITY), % | SOLUBILITY (AT ROOM TEMP.)[1] |
|---|---|---|---|---|
| 1 | Methacrylate copolymer resin | 40 | 64 | YES |
| 2 | PEMA | 63 | 45 | YES |
| 3 | PBMA | 55 | 150 | YES |
| 4 | PBMA | 35 | 250 | YES |
| 5 | Carboset ® 525 | 37 | 165 | YES |

[1] All polymers except Carboset ® 525 are soluble in acetone, toluene, and tetrahydrofuran at at least a 20% weight. Carboset ® 525 is soluble in acetone and methyl ethyl ketone at at least a 20% weight.

As is well known to those skilled in the art, commercially available polymers of the type described herein may contain small amounts of other polymerized material. Thus, it is intended that the chemical descriptions provided above shall mean those polymers that are substantially made up of the monomer(s) indicated. For example, a commercial ethylmethacrylate polymer may contain a few percent of methylmethacrylate. It is contemplated that such copolymers will fall within the invention as disclosed.

As mentioned earlier, the thermoplastic polymer may be used in combination with, ultraviolet stabilizers, anti-oxidants, plasticizers, coating acids, etc. Some useful ultraviolet stabilizers include benzotriazoles and benzophenones. Some useful anti-oxidants include hindered phenols such as tetrakis (methylene (3,5-di-t-butyl-4-hydroxyhydrocinnamate)) methane, and 1,3,5-trimethyl-2,4,6-tris(3,5-di-t-butyl)-4-hydroxybenzyl)-benzene.

The thermoplasticipolymer may be mixed with the optional ingredients and dissolved in an appropriate solvent. One advantage of this invention, is that the thermoplastic polymer is soluble in both flammable and nonflammable solvents. Some solvents suitable for practicing the invention include acetone, methyl ethyl ketone, ethyl acetate, tetrahydrofuran, toluene, methylene chloride, etc. The choice of solvent depends on the thermoplastic polymer used because solubility of each polymer varies with the particular solvent used. Preferred solvents include acetone, tetrahydrofuran and toluene because they are flammable and thus eliminate the environmental concerns associated with the use of nonflammable solvents such as methylene chloride.

The polymeric coating should be thick enough to insure structural integrity, but thin enough to avoid distortion of the image through a three-dimensional effect. In general, the dried coating weight of the polymeric layer may be in the range of about 40–200 mg/dm$^2$. The final thickness of this layer may not exceed about 0.002 cm, and is preferably about 0.001 cm thick.

ELASTOMERIC LAYER

An elastomeric layer is disposed between the polymeric layer and the imaged surface. Such a layer is particularly useful when the imaged surface is a tacky composition which has been toned with a colored particulate material. When a polymeric covering is placed directly on a toned image of this type, the optical density may change over the course of several hours before reaching its equilibrium level. It is believed that this may be due to incomplete wetting of the toned surface. However, when the protective covering of the invention, which has an elastomeric layer, is used, the equilibrium optical density is achieved immediately after lamination.

The elastomeric layer may be chosen from a variety of materials that will wet or flow into the toned areas. Preferably, this layer will comprise a clear, nonphotosensitive, tacky or slightly soft, deformable organic material. Particularly preferred materials are elastomeric polymers and mixtures thereof. Rubber type polymers, both natural and synthetic may be used, e.g., polyisobutylene, Thiokol® A, nitrile rubbers, butyl rubber, chlorinated rubbers, polymers of butadiene, poly(vinylisobutylether), and random, teleblock and block copolymers of butadiene or isoprene copolymerized with styrene, and neoprene, silicone elastomers, etc., in various proportions. Additionally, any highly plasticized thermoplastic polymeric layer will function as the elastomeric layer. As is readily apparent to those skilled in the art, the elastomeric layer may also contain such ingredients as tackifiers, anti-oxidants, etc. Any suitable solvent may be used to coat the elastomeric layer provided it is compatible with the solvent used in the polymeric layer. The coating weight of the elastomeric layer may vary over a wide range and is primarily determined by the other physical property requirements of the system. That is, the minimum coating weight is that which will provide a film with sufficient thickness to laminate evenly over the imaged surface. The maximum coating weight is that which will provide a film which will not distort the image, i.e., give a three-dimensional appearance. In general, the elastomeric layer may have a dried coating weight in the range of 10–100 mg/dm$^2$, and preferably 50 mg/dm$^2$. As noted above, the coating weight of the polymeric layer alone may be in the range of about 40–200 mg/dm$^2$, and the thickness of this layer may not exceed 0.002 cm, preferably about 0.001 cm. Accordingly, the thickness of the elastomeric layer may be such that the total thickness of the polymeric layer and the elastomeric layer combined, does not exceed about 0.002 cm.

SUBSTRATES

As will be readily apparent to those skilled in the art, the protective coating or overcoat of the invention may have additional layers adjacent to the polymeric layer and elastomeric layer respectively to facilitate handling and storage. Such additional layers may be particularly useful if the protective overcoat is to be stored in a roll prior to use. Accordingly, a polymeric layer may be applied to a removable substrate thereby producing in order the following three-layered structure: (a) removable substrate, (b) polymeric layer, and (c) elastomeric layer. The removable substrate would preferably be removed after lamination to an imaged surface.

An additional removable substrate may be applied to the elastomeric layer thereby producing in order the following four-layered structure: (a) first removable substrate, (b) polymeric layer; (c) elastomeric layer, and (d) second removable substrate. This additional or second substrate is different from the first and is removed prior to lamination to an imaged surface. The first and second removable substrates used in this invention are different in order to facilitate the peeling off of the second removable substrate prior to lamination of the element to the imaged surface.

Suitable materials for these additional coverings include silicone-treated or electrically discharged (ED) or corona-treated polyester or polyethylene, matte finished polyester or polyethylene, etc., which release readily from the layer they serve to protect. Gloss readings may vary depending on the particular substrate used. For example, if matte finished polyester or polyethylene is used as the substrate, lower gloss readings are obtained because of the matte surface left behind on the polymeric layer.

PROCESS OF USING THE PROTECTIVE COATING OR OVERCOAT OF THE INVENTION

A prepress color proof having the protective coating or overcoat of the invention provided thereon, is prepared in the following manner:

An element containing, in order, (a) a removable substrate; (b) a substantially transparent, nonphotosensitive, polymeric layer having a thickness of less than 0,002 cm and a gloss of 45–70; said polymeric layer consisting essentially of at least one thermoplastic polymer having an elongation at break of greater than 30%, and a glass transition temperature of 35°–70° C.; and (c) an elastomeric layer is laminated to a prepress color proof. The lamination is carried out in such a way that the elastomeric layer is adjacent the surface of the prepress color proof. The removable substrate is then peeled or stripped off and the polymeric layer becomes the outermost layer of the prepress color proof.

The element may have a second, different removable substrate laminated to the elastomeric layer. With this structure, the polymeric layer exhibits improved adhesion to the first removable substrate when the second removable substrate is removed, e.g., peeled off prior to lamination.

EXAMPLES

The protective coatings prepared in the following examples, were tested using the following procedures: Adhesion test/Peel test:

Peel test was used to measure the adhesion between the first removable substrate, which has been electronically discharged (ED) or non-ED treated, and the polymeric layer in the protective coating. When peeling off the second removable substrate, i.e., the silicone treated polyester substrate, prior to lamination, if adhesion of the polymeric layer to the ED treated or non-ED treated substrate is good, the coating is less likely to be peeled off with the silicone treated polyester substrate.

Two identical elements, each having in order a 0.0025 cm (0.001 inch)thick polyester base or substrate, a polymeric layer and an elastomeric layer (EL) were laminated to one another in such a way that the elastomeric layer of each element was in face-to-face contact and the polyester base of each element is on the outer surfaces, i.e., top and bottom of the laminate. The laminate was cut into 2.54 cm (1 inch)×33.02 cm (13 inch) strips for the peel test. The top polyester base was peeled off and then 2.54 cm (1 inch) of the polymeric layer was separated from the bottom polyester base on one end of the sample. The separated polymeric layer along with the elastomeric layers and the other polymeric layer were then taped to the peel tester lead. The bottom polyester base was subsequently taped to the fixed end of peel tester. Peeling was commenced at a speed of 0.211 meter/sec. Peel force from the tester was recorded. The peel instrument used was Model ZPE-1000 made by Instrumentors, Inc.

Blocking Test

It is preferred that prepress proofs have the capability of being stacked face-to-face and face-to-back, in conditions of high humidity and high temperatures without incurring any adverse consequences. For example, after lamination to a proof, the protective coating can soften under above room temperatures conditions, rendering it more tacky. Also, residual solvent affects the tackiness of the polymeric and elastomeric layers.

A set of weights was prepared to conduct the blocking test. Eight bottles with bottoms roughly 3" in diameter were required. Water was added until each bottle weighed 500 grams, and the top of each bottle were sealed. An element (Element 1) was prepared with a CR-1 Cromalin ® receptor stock, manufactured by E. I. du Pont de Nemours and Co. having laminated thereto 4 layers of photopolymer from a positive working element similar to that described in Example 3 of U.S. Pat. No. 3,649,268. The top layer of the photopolymer was exposed and developed with a yellow particulate toner similar to that described in U.S. Pat. No. 4,546,072.

A second element (Element 2) was prepared with a CRS-3 Cromalin ® receptor stock having laminated thereto 4 layers of the combination of the photohardenable, tonable organic contiguous, isolation, and adhesive layers from a negative-working element described in Example 1 of U.S. Pat. No. 5,234,790. The top layer of the element was exposed and developed with a yellow toner similar to that described in U.S. Pat. No. 4,546,072. Two additional elements (Elements 3 and 4) were prepared for use with the control protective coating. Element 3 was prepared in the same manner as Element 1 and Element 4 was prepared in the same manner as Element 2.

The protective coating of the invention was then laminated to elements 1 and 2 prepared earlier. The protective coating described in Comparative Example 1 was laminated to elements 3 and 4.

The polyester base was peeled off each laminate prepared from elements 1-4, and the laminates were cut into 10.16 cm×10.16 cm (4"×4") squares. A sample identification label was attached on the back of each square. The following procedures were then followed:

A) Two 4×4" square is were placed face-to-face with polymeric layers touching.

B) Two 4×4" squares were placed face-to-back with the polymeric layer touching the back of the CRS-3 Cromalin ® receptor.

One set of squares from the combination put together in A & B above was then placed on a flat surface and a 500 g weight with a 3 inch diameter bottom surface was placed on top of each sample combination. The samples placed on a flat surface were examined after 7 days.

A second set of squares from the combination put together in A & B above was then placed in a 40° C./40% relative humidity oven. A 500 g weight with a 3 inch diameter bottom surface was placed on top of each sample combination. After 7 days in the oven, the weights were removed from A & B sample combination. The sample was then allowed to cool to ambient temperature. After cooling, the squares were peeled apart.

Any sign of damage to the polymeric layer surface, which would indicate the samples had "blocked", i.e., stuck,together, was recorded.

Gloss:

Gloss measurements were made using a Gardner Glossgard Digital Model glossmeter (Gardner Co., Bethesda, Md.) at a 20° angle of incidence. Before actual measurements were taken on the samples, care was taken to insure proper calibration of the glossmeter at each of the angles by reading and adjusting (as necessary) the values obtained for white and black tile standards provided by the manufacturer. Samples consisted of protected coatings of the invention laminated to either CRS-3 Cromalin ® receptor or a four color prepress proof. The range of the Glossgard glossmeter is 0.0–199.9 gloss units with a precision of ±0.5 gloss units. Once the instrument has been calibrated, successive gloss measurements within a series may be compared. The gloss of a sample was measured by placing the glossmeter's aperture in the middle of the sample and recording the gloss value taken at 20° angle of incidence. Care was also taken to insure that the direction of measurements on the sample relative to the aperture was the same for all samples and in particular, within the polymeric series being evaluated. All laminations were performed at 98.9°–121.1° C. (210°–250° F.) on a Cromalin ® laminator, manufactured by E. I. DuPont de Nemours and Company, Wilmington, Del. Unless otherwise specified, all gloss values are in gloss units and all quantities are in grams.

In the following examples, the Polymer No. preceding the named polymer is the same polymer listed in the table provided in the section of this patent specification entitled "Polymeric Layer".

EXAMPLE 1

The following example describes the preparation of the protective coating, i.e., the polymeric and elastomeric layers.

A polymeric layer was prepared having the following composition:

| Ingredients | Amount (parts by weight) |
| --- | --- |
| Polymer $2^a$ (or PEMA) | 25.64 |
| 2-(2'-Hydroxy-3',5'-di-tert-amylphenyl)benzotriazole | 0.13 |
| 2-2'-Dihydroxy-4-methoxybenzophenone | 0.20 |
| Tetrakis(methylene(3,5-di-t-butyl-4- | 0.03 |

-continued

| Ingredients | Amount (parts by weight) |
| --- | --- |
| hydroxyhydrocinnamate)) methane | |
| Acetone | 74.00 |
| Total: | 100.00 |

[a] Inherent viscosity = 0.80 at 20° C., 0.25 grams of polymer in 50 ml of methylene chloride, No. 50 Cannon-Fenske Viscometer.

An elastomeric layer was prepared having the following composition:

| Ingredients | Amount (parts by weight) |
| --- | --- |
| Cis-polybutadiene rubber | 8.08 |
| Styrene-butadiene rubber | 0.90 |
| Tetrakis(methylene(3,5-di-t-Butyl-4-hydroxyhydrocinnamate)) methane | 0.02 |
| Toluene | 91.00 |
| Total | 100.00 |

The polymeric and elastomeric layers were coated simultaneously using a dual-slot die, on the supports specified in Table 1 below, with the polymeric layer contacting the support. After drying out the solvent the resulting three layered element was tested for adhesion and blocking. Another sample of the three-layered element was laminated to a CRS-3 Cromalin ® receptor, the support was peeled off, and then tested for gloss. The results are provided in Table 1 below.

TABLE 1

| | |
| --- | --- |
| Gloss (clear Mylar ®, non-ED) | 46 |
| Gloss (clear Mylar ®, ED) | 54 |
| Gloss (Matte Mylar ®, non-ED) | 9[a] |
| Adhesion (clear Mylar ®, non-ED) | 68 gram load |
| Adhesion (clear Mylar ®, ED) | too strong, coating breaks when peeling |
| Adhesion (Matte Mylar ®, non-ED) | 66 gram load |
| Blocking | OK, i.e., no visible blocking observed (7 day test) |

[a] Gloss reading of 9 was obtained because of the matte Mylar ® used which left behind a matte surface on the polymeric layer.

COMPARATIVE EXAMPLE 1

A protective coating was prepared and tested as described in Example 1 with the following exceptions: the polymeric layer had the following composition.

| Ingredients | Amount (parts by weight) |
| --- | --- |
| Poly(methyl methacrylate) (PMMA)[a] | 11.70 |
| Poly(vinyl acetate) (PVAc)[b] | 5.29 |
| Polyethylene glycol (PEG) | 0.72 |
| Polyethylene oxide (PEO) | 0.09 |
| 1-(2'-Hydroxy-3',5'-di-tert-amylphenyl)benzotriazole | 0.09 |
| 2-2'-Dihydroxy-4-methoxybenzophenone | 0.09 |
| Tetrakis(methylene(3,5-di-t-butyl-4-hydroxyhydrocinnamate)) methane | 0.02 |
| Methylene chloride | 82.00 |
| Total | 100.00 |

[a] Inherent viscosity = 1.28 at 20° C., 0.25 grams of polymer in 15 ml of chloroform, No. 50 Cannon-Fenske Viscometer.
[b] Brookfield viscosity = 825 centipoise at 20° C., 60 RPM, 30% polymer in benzene.

The elastomeric layer had the following composition:

| Ingredients | Amount (parts by weight) |
| --- | --- |
| Cis-polybutadiene rubber | 4.94 |
| Styrene-butadiene rubber | 0.55 |
| Tetrakis(methylene(3,5-di-t-butyl-4-hydroxyhydrocinnamate)) methane | 0.01 |
| Methylene chloride | 94.50 |
| Total | 100.00 |

Gloss, adhesion, and blocking results are provided in Table 2 below:

TABLE 2

| | |
| --- | --- |
| Gloss (clear Mylar ®, ED) | 53 |
| Gloss (matte Mylar ®, ED) | 8 |
| Adhesion (clear Mylar ®, ED) | 15 gram load |
| Blocking | OK, i.e., no visible blocking observed (7 day test) |

EXAMPLE 2

This example illustrates application of the protective covering of the invention to a prepress proof.

The protective coatings prepared in accordance with Example 1 were laminated to positive and negative Cromalin ® prepress proofs. A negative-working photosensitive element similar to that described in Example 1 of U.S. Pat. No. 5,234,790, was used to prepare a negative prepress proof. The negative-working proofing film contains, in order from top to bottom (1) a strippable coversheet, (2) a photohardenable layer which is generally, non-tacky, (3) a nonphotosensitive, elastomeric, tonable organic contiguous layer which is tonable by application of particulate material, (4) a non-elastomeric isolation layer, (5) an adhesive layer, and (6) a sheet support. The samples were prepared by laminating the above element (after removal of the sheet support) to a CRS-3 Cromalin ® receptor manufactured by DuPont, imagewise exposing through a transparency, removing the strippable cover sheet, and developing with a yellow toner, similar to that described in U.S. Pat. No. 4,546,072 and manufactured by DuPont. The above steps were repeated with three different transparencies and three different colored toners to form a prepress proof. The protective coating from Example 1 and Comparative Example 1 were then laminated to the prepress proof, with the elastomeric layer adjacent to the prepress proof, to form Samples 1 and 2, respectively, for the negative-working prepress proof. The support on the protective coating was then removed.

A positive-working photosensitive element similar to that described in Example 3, U.S. Pat. No. 3,469,268, was used to prepare a positive prepress proof. The element contained a support, a tacky photopolymerizable layer, and a strippable cover sheet. After peeling off the coversheet, the element was laminated to a CR-1 Cromalin ® receptor manufacture by DuPont, and imagewise exposed through a transparency. The support was peeled off, and the imagewise tacky areas were toned with a transparent yellow toner, similar to that described in U.S. Pat. No. 4,546,072 and manufactured by DuPont. The above steps were repeated with three different transparencies and three different colored toners to form a prepress proof. The protective coating from Example 1 and Comparative Example 1 were then laminated to the prepress proof, with the elastomeric layer adjacent to the prepress proof, to form Samples 3 and 4, respectively, for the positive-working prepress proof. The support on the protective coating was then removed. Both positive and negative working elements exhibited low gloss, good adhesion and blocking characteristics. Results from gloss tests are indicated in Table 3 below.

TABLE 3

| Sample No. | Gloss |
|---|---|
| 1 | 54 |
| 2 | 56 |
| 3 | 51 |
| 4 | 52 |

EXAMPLE 3

Protective coatings were prepared and tested as described in Example 1 with the following exceptions: the polymeric layer had the following composition.

| Ingredients | Amount (parts by weight) |
|---|---|
| Polymer 2$^a$ (PEMA) | 19.24 |
| Polymer 4$^b$ (PBMA) | 6.40 |
| 2-(2'-Hydroxy-3',5'-di-tert-amylphenyl) benzotriazole | 0.13 |
| 2-2'-Dihydroxy-4-methoxybenzophenone | 0.20 |
| Tetrakis(methylene(3,5-di-t-butyl-4-hydroxyhydrocinnamate)) methane | 0.03 |
| Acetone | 74.00 |
| Total | 100.00 |

$^a$Inherent viscosity = 0.80 at 20° C., 0.25 grams of polymer in 50 ml of methylene chloride, No. 50 Cannon-Fenske Viscometer.
$^b$Inherent viscosity = 0.54 at 20° C., 0.25 grams of polymer in 50 ml methylene chloride, No. 50 Cannon-Fenske Viscometer.

Gloss, adhesion and blocking results are provided in Table 4 below:

TABLE 4

| Gloss (clear Mylar ®, non-ED) | 46 |
|---|---|
| Gloss (clear Mylar ®, ED) | 50 |
| Adhesion (clear Mylar ®, non-ED) | 43 gram load |
| Adhesion (clear Mylar ®, ED) | too strong, coating breaks when peeling |
| Blocking | OK, i.e., no visible blocking observed (7 day test) |

EXAMPLE 4

Example 1 was repeated with the following exceptions: the polymeric layer had the following composition:

| Ingredients | Amount (parts by weight) |
|---|---|
| Polymer 3$^a$ (PBMA) | 24.73 |
| 2-(2'-Hydroxy-3',5'-di-tert-amylphenyl) benzotriazole | 0.12 |
| 2-2'-Dihydroxy-4-methoxybenzophenone | 0.12 |
| Tetrakis(methylene(3,5-di-t-butyl-4-hydroxyhydrocinnamate)) methane | 0.03 |
| Methylene chloride | 75.00 |
| Total | 100.00 |

$^a$Inherent viscosity = 0.63 at 20° C., 0.25 grams of polymer in 50 ml methylene chloride, No. 50 Cannon-Fenske Viscometer.

The elastomeric layer had the following composition:

| Cis-polybutadiene rubber | 4.94 |
|---|---|
| Styrene-butadiene rubber | 0.55 |
| Tetrakis(methylene(3,5-di-t-butyl-4-hydroxyhydrocinnamate)) methane | 0.01 |
| Methylene chloride | 94.50 |
| Total | 100.00 |

Gloss and blocking results are provided in Table 5 below.

TABLE 5

| Gloss (clear Mylar ®, non-ED) | 50 |
|---|---|
| Blocking | OK, i.e., no visible blocking observed (7 day test) |

What is claimed is:
1. An element consisting essentially of, in order:
   (a) a removable substrate;
   (b) a transparent, nonphotosensitive, polymeric layer having a thickness of less than about 0.002 cm and a gloss of 45–70; said polymeric layer consisting essentially of at least one thermoplastic polymer having an elongation at break of greater than 30%, and a glass transition temperature of 35°–70° C.; and
   (c) a non-photosensitive elastomeric layer.
2. The element of claim 1 further comprising an additional different, removable substrate (d) adjacent to the elastomeric layer, wherein the polymeric layer exhibits improved adhesion to the removable substrate (a) when substrate (d) is removed.
3. The element of claim 1 or 2 wherein the thermoplastic polymer has a solubility in acetone of at least 15 grams per 100 grams of acetone at 25° C.
4. The element of claim 1 or 2 wherein the thermoplastic polymer consists essentially of an acrylate-type thermoplastic polymer.
5. The element of claim 4 wherein the acrylate-type thermoplastic polymer is selected from the group consisting of poly(ethyl methacrylate), poly(butyl methacrylate), and methacrylate copolymer.
6. The element of claim 5 wherein the methacrylate copolymer consists essentially of a methyl methacrylate copolymer.
7. The element of claim 1 or 2 wherein the elastomeric layer comprises at least one elastomeric polymer or mixtures of elastomeric polymers.

* * * * *